US008456395B2

(12) United States Patent
Liu

(10) Patent No.: US 8,456,395 B2
(45) Date of Patent: Jun. 4, 2013

(54) METHOD FOR ADJUSTING SETTINGS OF A DISPLAY PANEL

(75) Inventor: Tsung-I Liu, Tainan (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 918 days.

(21) Appl. No.: 12/292,585

(22) Filed: Nov. 21, 2008

(65) Prior Publication Data

US 2009/0140966 A1 Jun. 4, 2009

(30) Foreign Application Priority Data

Dec. 4, 2007 (TW) .............................. 96146083 A

(51) Int. Cl.

| | |
|---|---|
| ***G09G 3/36*** | (2006.01) |
| ***G09G 5/00*** | (2006.01) |
| ***G09G 5/10*** | (2006.01) |
| ***G09G 5/02*** | (2006.01) |
| ***G06F 3/041*** | (2006.01) |
| ***G06F 3/038*** | (2006.01) |
| ***G06F 3/00*** | (2006.01) |
| ***G06F 5/00*** | (2006.01) |
| ***G06F 13/12*** | (2006.01) |
| ***G06F 13/38*** | (2006.01) |
| ***G06F 3/048*** | (2006.01) |
| ***H04N 17/00*** | (2006.01) |
| ***H04N 17/02*** | (2006.01) |
| ***H01L 23/58*** | (2006.01) |
| ***G01R 35/00*** | (2006.01) |

(52) U.S. Cl.

USPC ............. 345/87; 345/178; 345/204; 345/205; 345/206; 345/207; 345/619; 345/690; 345/691; 345/692; 345/693; 345/694; 345/695; 345/696; 345/697; 345/698; 345/699; 257/48; 324/601; 348/190; 710/8; 710/14; 710/15; 710/19; 710/55; 710/62; 710/63; 710/64; 710/65; 710/72; 710/73; 715/856

(58) Field of Classification Search

USPC ............................................................ 345/87

See application file for complete search history.

(56) References Cited

U.S. PATENT DOCUMENTS

| | | | | |
|---|---|---|---|---|
| 5,031,118 | A * | 7/1991 | Morizot | 345/698 |
| 5,245,326 | A * | 9/1993 | Zalph | 345/92 |
| 5,375,210 | A * | 12/1994 | Monnes et al. | 710/10 |
| 5,581,788 | A * | 12/1996 | Ballare | 710/14 |
| 5,625,386 | A * | 4/1997 | Howard et al. | 345/540 |
| 6,223,283 | B1 * | 4/2001 | Chaiken et al. | 713/1 |
| 6,434,606 | B1 * | 8/2002 | Borella et al. | 709/214 |
| 6,543,690 | B2 * | 4/2003 | Leydier et al. | 235/451 |

(Continued)

*Primary Examiner* — Alexander S Beck
*Assistant Examiner* — K. Kiyabu
(74) *Attorney, Agent, or Firm* — Bacon & Thomas, PLLC

(57) ABSTRACT

A panel adjustment method is executed on a host to adjust settings of a panel connected to the host through a serial bus. The method determines whether the panel is supported by the host. When the panel is supported by the host, the settings of the panel is read from a database of the host to accordingly set the panel. It is further determined whether the panel is correctly set or not. When the panel is correctly set, it is further determined whether the panel is of a frame buffer mode or not. When the panel is of a frame buffer mode, it is determined whether a header file generation is required or not. When the header file generation is required, the settings and a panel name are included in an include file. The include file is compiled to thereby generate a binary file which is loaded into the panel.

10 Claims, 5 Drawing Sheets

U.S. PATENT DOCUMENTS 6,785,713 B1 * 8/2004 Freeman et al. .............. 709/208
7,366,886 B2 * 4/2008 Yoo .................................. 713/1
7,450,084 B2 * 11/2008 Fuller et al. .................... 345/1.1
7,583,256 B2 * 9/2009 Park et al. ..................... 345/204
7,812,832 B2 * 10/2010 Mendelson et al. .......... 345/204
2002/0147879 A1 * 10/2002 Arai et al. ..................... 710/305

* cited by examiner

METHOD FOR ADJUSTING SETTINGS OF A DISPLAY PANEL

BACKGROUND OF THE INVENTION

1. Field of the Invention

The present invention relates to the technical field of setting adjustment of a panel and, more particularly, to a panel adjustment method applied in a factory production.

2. Description of Related Art

Thin film transistor liquid crystal displays (TFT LCDs) are the most rapid developing product after the semiconductor devices. However, for consideration of costs and material sources, LCD manufacturers do not insistently use the panels from the same supplier.

For a fast cost change in the global panel market, the LCD manufacturers are changing the panel suppliers frequently. Accordingly, the same type of LCDs may use two or more different types of panels from different factories. Since different types of panels have different features, LCDs on the production line require a calibration process to ensure that the same type of LCDs can have the same display feature and effect.

The calibration is performed on the contrast and brightness of an LCD as the internal elements are fixed. Thereby it obtains an optimal corresponding ratio and an optimal representation to an LCD frame. Typically, calibrating the "golden LCD" having the high definition which is then used as a standard for calibration of all the same type of LCDs requires a professional hardware engineer for two to four hours. The LCD manufacturers need a professional calibration to increase the entire display quality and ensure that all types of panels can have a same display effect, which is not satisfactory to the LCD manufacturers. Accordingly, due to the consideration of cost control, it is desirable to provide an improved calibration to mitigate and/or obviate the aforementioned problems.

SUMMARY OF THE INVENTION

The object of the present invention is to provide a panel adjustment method, which increases the display quality of an LCD and presents the same effect on all types of panels.

According to a feature of the invention, a panel adjustment method is provided, which is executed on a host to adjust settings of a panel connected to the host through a serial bus. The method includes the steps of:

(A) determining whether the panel is supported by the host; (B) reading the settings of the panel from database of the host to accordingly set the panel when the panel is supported by the host, and further determining whether the panel is correctly set; (C) determining whether the panel is at a frame buffer mode when the panel is correctly set; (D) determining whether generating a header file is required when the panel is at a frame buffer mode; (E) inputting an include file and a panel name, placing the settings and the panel name in the include file, and storing the include file when generating the header file is required; and (F) compiling the include file to thereby generate a binary file, and loading the binary file into the panel.

According to another feature of the invention, a computer readable recording medium is provided, which loads a program for execution on a host to adjust settings of a panel connected to the host through a serial bus. The program includes: a first procedure, which determines whether the panel is supported by the host; a second procedure, which reads the settings of the panel from database of the host to accordingly set the panel when the panel is supported by the host, and further determines whether the panel is correctly set; a third procedure, which determines whether the panel is at a frame buffer mode when the panel is correctly set; a fourth procedure, which determines whether generating a header file is required when the panel is at the frame buffer mode; a fifth procedure, which places the settings and a panel name in an include file and stores the include file when generating the header file is required; and a sixth procedure, which) compiles the include file to thereby generate a binary file, and loads the binary file into the panel.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
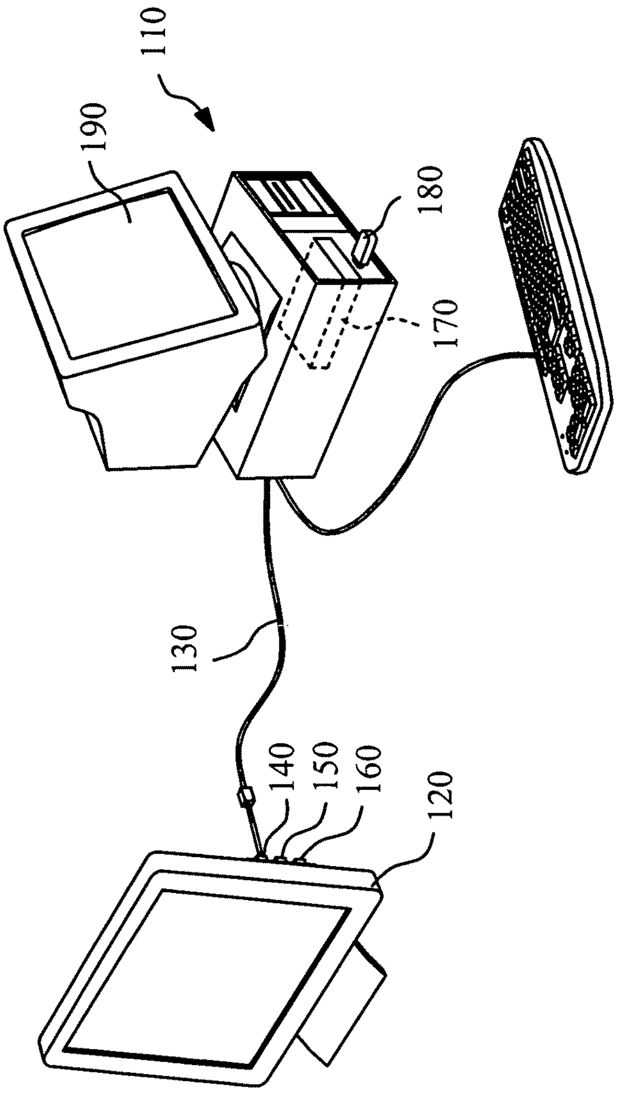
FIG. 1 is a schematic view of an application of a panel adjustment method according to the invention.

FIG. 1 is a schematic view of an application of a panel adjustment method according to the invention. The method is applied to a host 110 for adjusting the settings of a panel 120. The panel 120 can be an LCD monitor or an LCD television. The panel 120 is connected to the host 110 through a serial bus 130. The serial bus 130 is implemented to one of a video graphics array (VGA), a digital visual interface (DVI) and a high definition multimedia interface (HDMI) connection interfaces 140, 150 and 160, respectively on the panel 120. The USB 130 is preferably an RS232, I2C and the like.

The panel adjustment method is implemented as a software program with a computer language and stored in a hard disk 170 or a flash drive 180.

Figure 2:
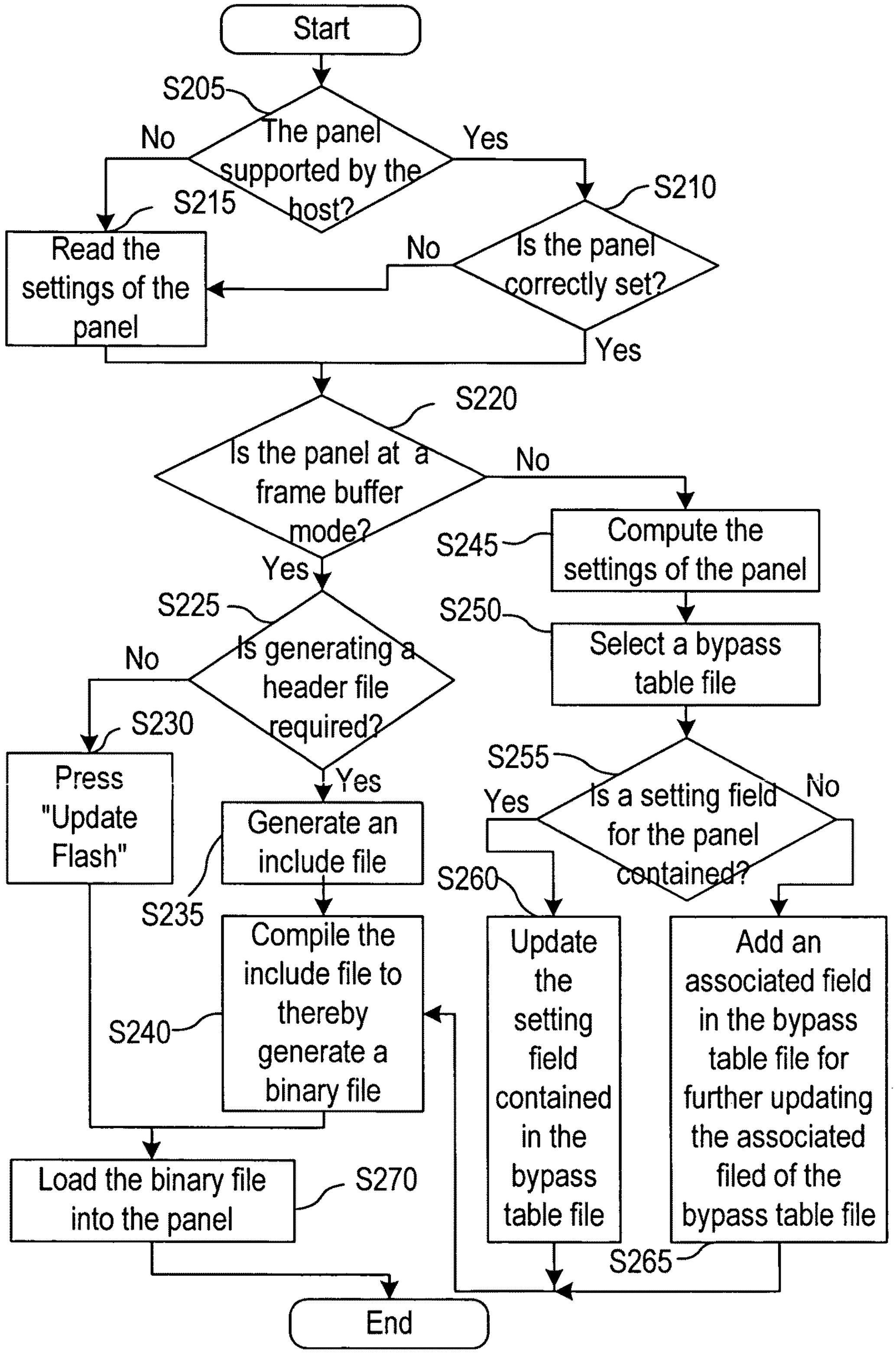
FIG. 2 shows a flowchart of a panel adjustment method according to the invention.
Figure 3:
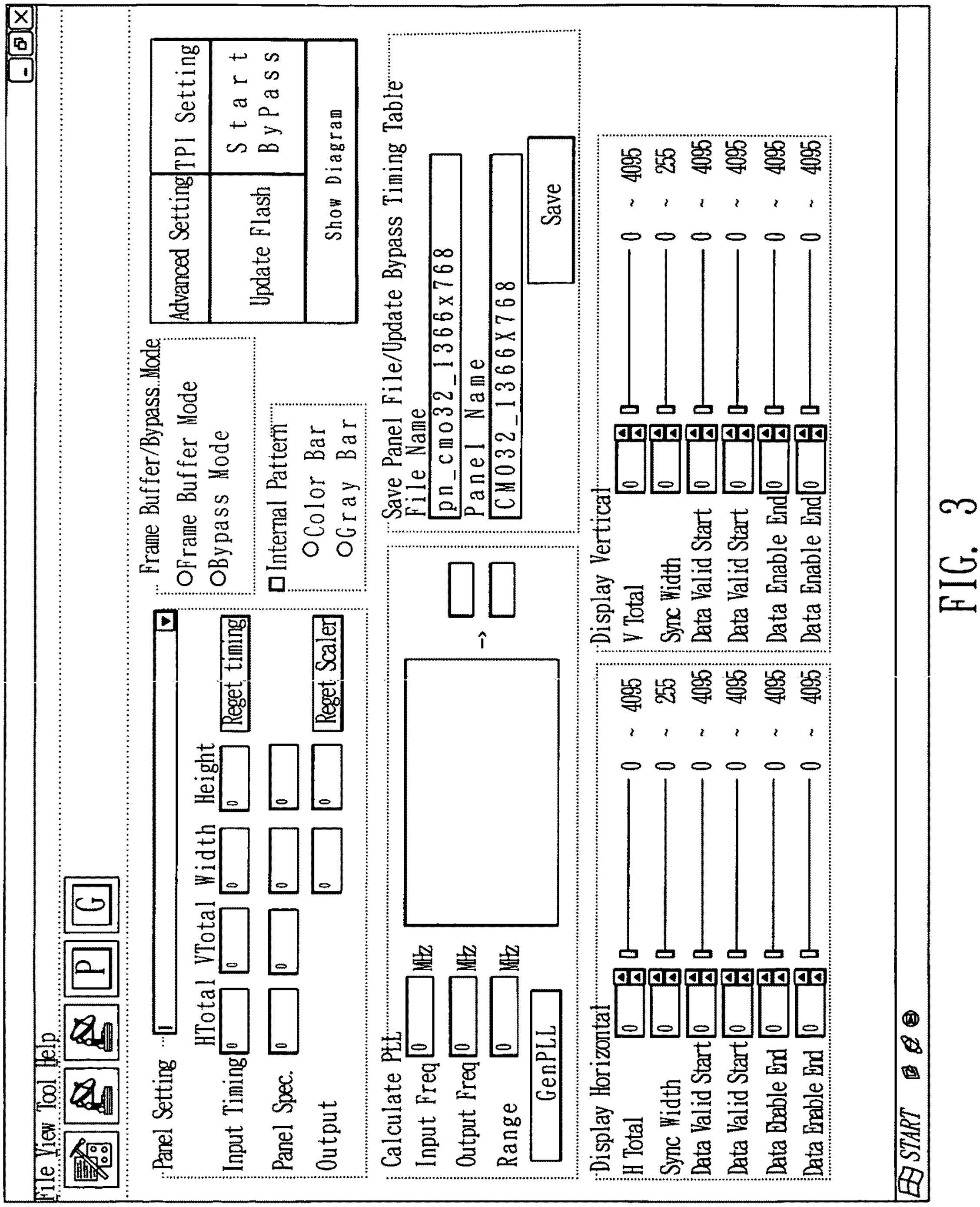
FIG. 3 is a schematic diagram of a user interface (UI) for a panel adjustment method according to the invention.

FIG. 2 shows a flowchart of the panel adjustment method according to the invention. FIG. 3 is a schematic diagram of a user interface (UI) displayed on the panel 190 of the host 110 when a panel adjustment method is executed.

As shown in FIGS. 2 and 3, step S205 determines whether the panel 120 is supported by the host 110. When a settings file for the panel 120 is stored in database of the host 110, it is determined that the panel 120 is supported by the host 110. For example, in case that the panel 120 is an AUO32" panel supplied by AU Optronics Corp., it is determined that the panel 120 is supported by the host 110 when the file auo32.txt is stored in the database.

Conversely, when step S205 determines that the panel 120 is not supported by the host 110, step S215 is executed to further input the settings of the panel 120. In step S215, a panel specification field "Panel Spec", an advanced setting field "Advanced Setting", an output frequency field "Output Freq", a horizontal display field "Display Horizontal" and a vertical display field "Display Vertical" are the essential input settings.

When the panel 120 is supported by the host 110, step S210 reads the settings of the panel 120 from the database of the host 110 to accordingly set the panel 120 and further determines whether the panel 120 is correctly set.

When the panel is not correctly set, step S215 is executed to further input the settings of the panel 120.

When the panel is correctly set, step S220 determines whether the panel 120 is at a frame buffer mode.

Step S220 is based on the size of memory (not shown) from the panel 120 to determine whether the panel 120 is at the frame buffer mode. When the size of the memory is greater than a threshold, it is determined that the panel 120 is at frame buffer mode, and otherwise it is determined that the panel 120 is at a bypass mode. When the memory of the panel 120 is essentially used as a frame buffer. However, only when the memory of the panel 120 is greater than the threshold, the memory is regarded as the frame buffer, and otherwise the memory is regarded as a bypass buffer in the bypass mode.

When the panel is at the frame buffer mode, step S225 determines whether to generate a header file (.h file) for change.

When generating the header file is not required in step S225, a button "Update Flash" of FIG. 3 is pressed to load the settings into the panel 120 (step S230).

When generating the header file is required, it indicates that the panel 120 to be recorded by the host 110 uses another panel, and in this case step S235 inputs an include file and a panel name. The settings and the panel name are placed in the include file, and the include file is stored. For example, the AUO32" panel supplied by AU Optronics Corp. is changed into a CMO32" panel supplied by CHIMEI Corp. Namely, the include file CM032.h and the panel name CMO32#1 is input in order to include the panel name CMO32#1 and associated settings in the include file CMO32.h.

Step S240 recompiles the include file to thereby generate a binary file, and step S270 loads the binary file into the panel.

Figure 4:
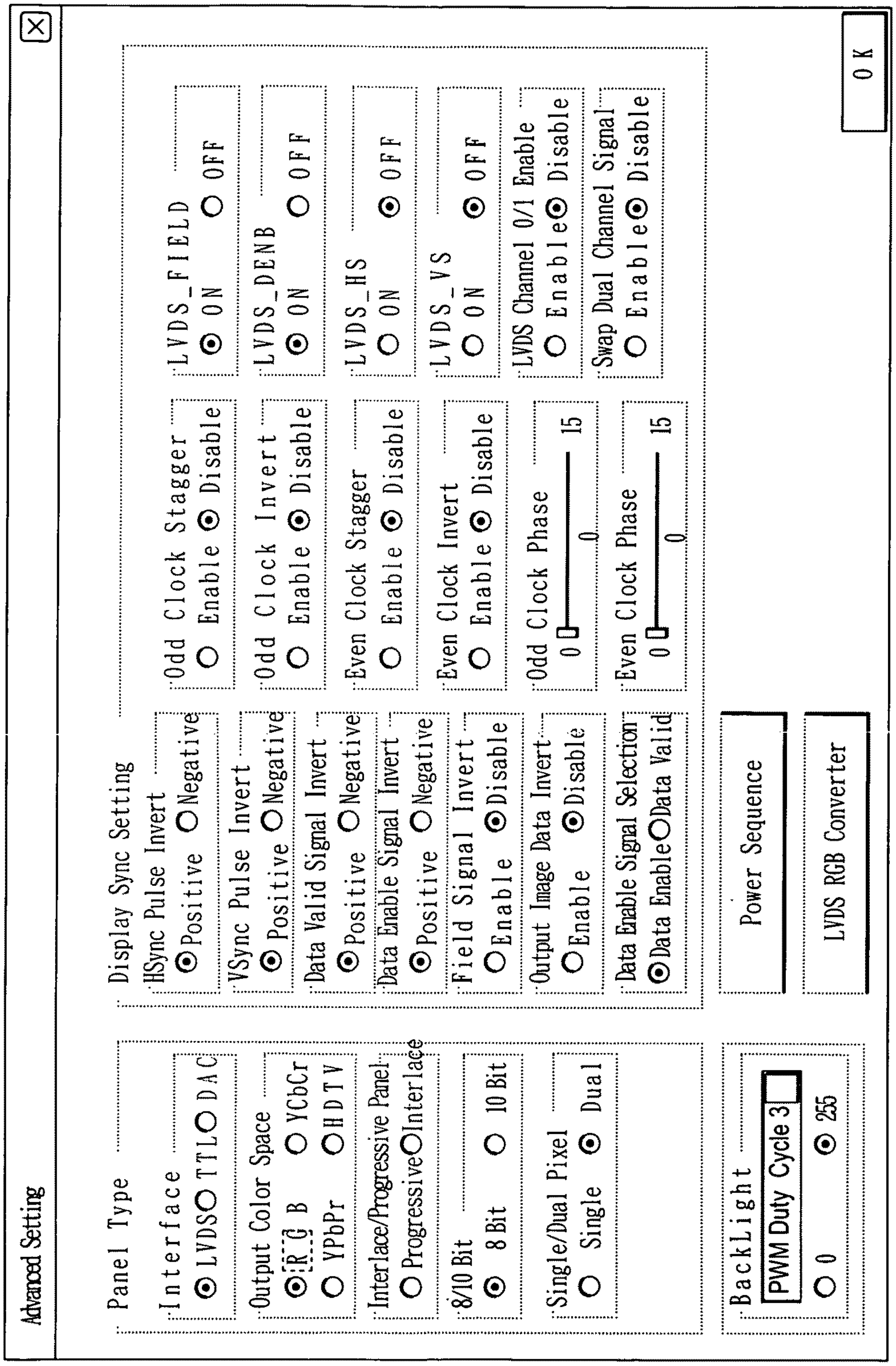
FIG. 4 is a schematic diagram of an advanced setting UI for a panel adjustment method according to the invention.
Figure 5:
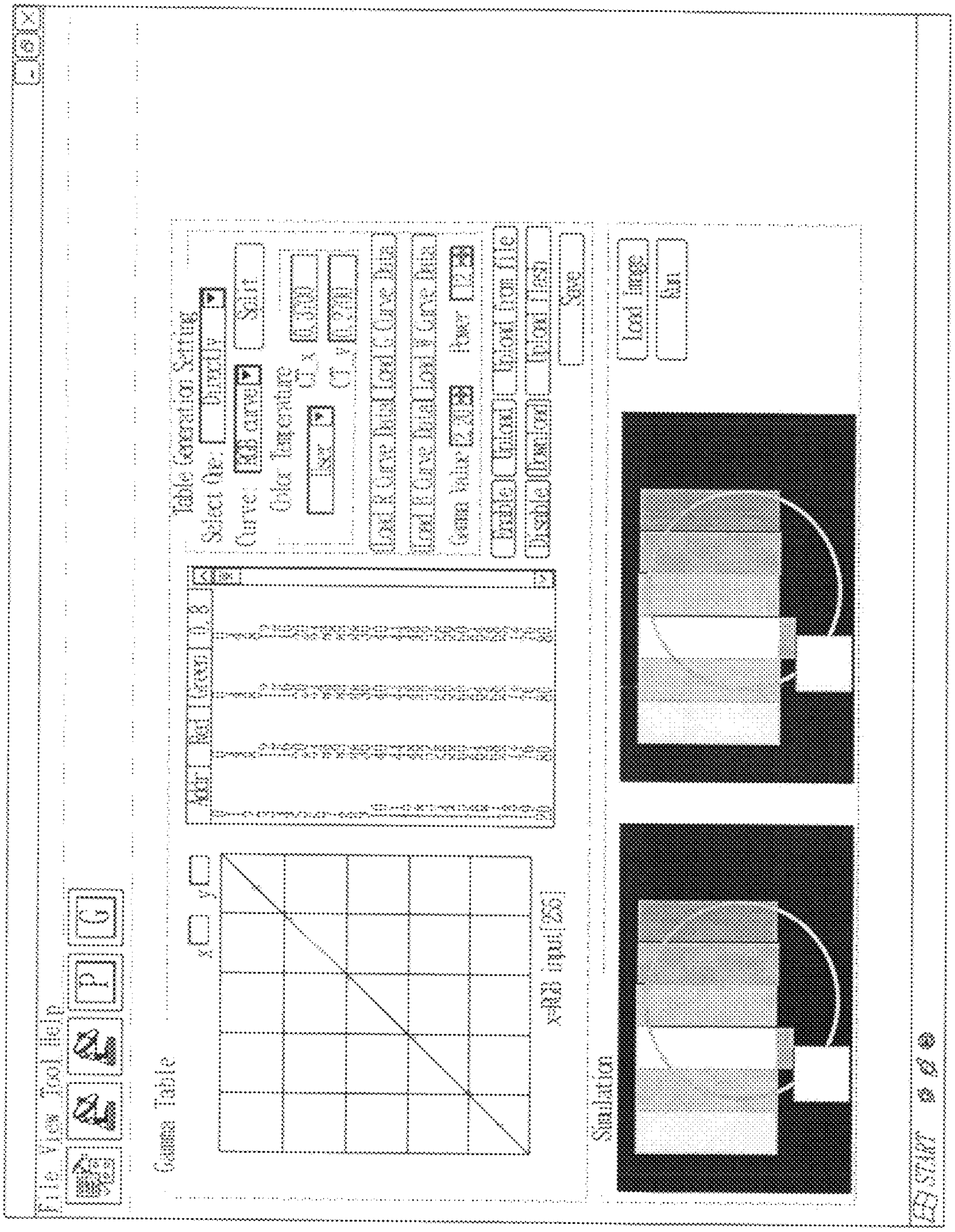
FIG. 5 is a schematic diagram of a Gamma setting UI for a panel adjustment method according to the invention.

When step S220 determines that the panel is at a bypass mode, the settings of the panel are computed, which is done by pressing the button "Start Bypass" of FIG. 3. Since the panel 120 is at the bypass mode, the timing is stricter than that at the frame buffer mode. Thus, the method computes the pixel clock and adjusts the horizontal and vertical synchronous parameters Hsync and Vsync of the panel 120 (step S245). In addition, when the button "Advance Setting" of FIG. 3 is pressed, a display picture is shown in FIG. 4 in which a schematic diagram of an advanced setting UI of a panel adjustment method applied to a panel 190 of the host 110 is provided. When a button "G" of FIG. 3 is pressed, a picture for inputting Gamma settings by the operator is shown in FIG. 5 in which a schematic diagram of a Gamma setting UI of a panel adjustment method is provided.

Step S250 selects a bypass table file. Step S255 determines whether the bypass table file contains a setting field for the panel 120. The bypass table file has a filename extension ".h".

In step S260, when step S255 determines that the bypass table file contains the setting field, the settings computed in step S245 is used to update the setting field of the bypass table file, and step S240 is executed.

In step S265, when step S255 determines that the bypass table file does not contain the setting field, an associated field is added in order to use the settings computed in step S245 to update the setting field of the bypass table file, and then step S240 is executed.

The method of the invention can be implemented with a computer language and stored in a computer readable medium which can be recognized and read by a microprocessor or in a product and device that contains the medium. The medium can be a hard disk, floppy, optical disk, ZIP, MO, RAM and so on. Since the method to update the operating system is completely disclosed as cited above, a person skilled in computer language can code the required software program with reference to this description, so a further detail is not described any more.

As cited, the invention concludes the parameters for different panels and computes the timing for the panels in program. When the panel 120 is at a frame buffer mode, a header file (.h) is produced and compiled to thereby produce a binary file, and the flash is directly updated to save the compiling time. When the panel 120 is at a bypass mode, the pixel clock is automatically computed to thereby adjust the settings Hsync and Vsync of the panel 120 to thereby reduce the time taken to calibrate the settings of the panel 120 by a professional hardware engineer and ensure that the same effect can be presented on all used panels. Thus, the picture quality of the LCD is entirely increased.

Although the present invention has been explained in relation to its preferred embodiment, it is to be understood that many other possible, modifications and variations can be made without departing from the spirit and scope of the invention as hereinafter claimed.

What is claimed is:

1. A panel adjustment method for calibrating liquid crystal display (LCD) panel during manufactory to obtain an optimal corresponding ratio and an optimal representation for the LCD panel, which is executed on a host to adjust settings of the LCD panel connected to the host through a serial bus, in which the host is connected to a main display panel for showing messages on the main display panel, the method comprising the steps of:

(A1) displaying a user interface on the main display panel;

(A2) determining whether the LCD panel is supported by the host based on whether a settings file for the LCD panel is stored in a database of the host;

(B) when the LCD panel is supported by the host, reading the settings file for the LCD panel from the database of the host to accordingly set the LCD panel, and further determining whether the LCD panel is correctly set;

(C1) when the LCD panel is correctly set, determining whether a memory size of the LCD panel is greater than a threshold;

(C2) when the memory size of the LCD panel is greater than the threshold, treating the LCD panel as in a frame buffer mode, and otherwise treating the LCD panel as in a bypass mode;

(D) when the LCD panel is in the frame buffer mode, determining whether generating a header file is required;

(E) when generating the header file is required, inputting an include file and a panel name, placing the settings and the panel name in the include file and storing the include file; and (F) compiling the include file to thereby generate a binary file, and loading the binary file into the LCD panel.

2. The method as claimed in claim 1, further comprising the step of:

(G) loading the settings into the LCD panel when step (D) determines that generating the header file is not required.

3. The method as claimed in claim 2, further comprising the steps of:

(H) computing the settings of the LCD panel when step (C2) determines that the LCD panel is at the bypass mode;

(I) selecting a bypass table file;

(J) determining whether the bypass table file contains a setting field for the LCD panel; and (K) using the settings of the LCD panel computed in step (H) to update the setting field of the bypass table file when the bypass table file contains the setting field for the LCD panel, and executing step (F).

4. The method as claimed in claim 3, further comprising the step of:

(L) adding an associated field for using the settings of the panel computed in step (H) to update the associated field of the bypass table file when the bypass table file does not contain the setting field for the LCD panel, and executing step (F).

5. The method as claimed in claim 4, further comprising the step of:

(M) inputting the settings of the LCD panel when step (A2) determines that the LCD panel is not supported by the host.

6. The method as claimed in claim 5, further comprising the step of:

(N) inputting the settings of the LCD panel when step (B) determines that the LCD panel is not correctly set, and executing step (C1).

7. The method as claimed in claim 6, wherein step (C2) is based on the memory size of the LCD panel to determine whether the LCD panel is at the frame buffer mode.

8. The method as claimed in claim 7, wherein the LCD panel is determined to be at the frame buffer mode when the memory size of the LCD panel is greater than the threshold, and conversely the LCD panel is at the bypass mode.

9. The method as claimed in claim 8, wherein the include file in step (E) has a filename extension ".h".

10. The method as claimed in claim 9, wherein the bypass table file has a filename extension ".h".

* * * * *